(12) United States Patent
Sakata et al.

(10) Patent No.: US 8,012,529 B2
(45) Date of Patent: Sep. 6, 2011

(54) LIGHT EMITTING ELEMENT AND MANUFACTURING METHOD THEREOF

(75) Inventors: Junichiro Sakata, Kanagawa (JP); Masakazu Murakami, Kanagawa (JP); Koji Moriya, Kanagawa (JP); Yoshiaki Oikawa, Tochigi (JP); Taketomi Asami, Saitama (JP); Hisashi Ohtani, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 864 days.

(21) Appl. No.: 11/779,363

(22) Filed: Jul. 18, 2007

(65) Prior Publication Data

US 2007/0259466 A1 Nov. 8, 2007

Related U.S. Application Data

(63) Continuation of application No. 10/925,033, filed on Aug. 25, 2004, now Pat. No. 7,291,967.

(30) Foreign Application Priority Data

Aug. 29, 2003 (JP) .................. 2003-308126

(51) Int. Cl.
*B05D 5/06* (2006.01)
*C23F 1/00* (2006.01)

(52) U.S. Cl. .......... 427/66; 427/271; 427/273; 427/534; 427/535; 427/539; 427/558; 216/13; 216/67; 216/76; 216/94; 216/99

(58) Field of Classification Search ............... 427/66, 427/271, 273, 534, 535, 537, 539, 558; 216/13, 216/67, 76, 94, 99
See application file for complete search history.

(56) References Cited

U.S. PATENT DOCUMENTS

| | | | |
|---|---|---|---|
| 5,294,810 A | 3/1994 | Egusa | |
| 5,640,067 A | 6/1997 | Yamauchi | |
| 5,744,824 A | 4/1998 | Kousai et al. | |
| 6,111,274 A | 8/2000 | Arai | |
| 6,222,314 B1 | 4/2001 | Arai | |
| 6,284,394 B1 | 9/2001 | Arai et al. | |
| 6,399,222 B2 | 6/2002 | Arai | |

(Continued)

FOREIGN PATENT DOCUMENTS

EP 1024542 A1 8/2000

(Continued)

OTHER PUBLICATIONS

C.W. Wang et al.; "Electroluminescence of doped organic thin films"; *Journal of Applied Physics*, vol. 65, No. 9; pp. 3610-3616; May 1, 1989.

(Continued)

*Primary Examiner* — James Lin
(74) *Attorney, Agent, or Firm* — Fish & Richardson P.C.

(57) ABSTRACT

According to the invention, an insulating or semi-insulating barrier layer which has a thickness where a tunnel current can flow through is provided between a hole injection electrode and an organic compound layer with hole transport characteristics (a hole injection layer or a hole transport layer). Specifically, a thin insulating or semi-insulating barrier layer which contains silicon or silicon oxide; silicon or silicon oxide and a light transmitting conductive oxide material; or silicon or silicon oxide, a light transmitting conductive oxide material, and carbon may be provided between a light transmitting conductive oxide film formed of a light transmitting conductive oxide material, such as ITO and a hole injection layer containing an organic compound.

12 Claims, 10 Drawing Sheets

U.S. PATENT DOCUMENTS

| | | |
|---|---|---|
| 6,416,888 B1 | 7/2002 | Kawamura |
| 6,448,580 B1 | 9/2002 | Arai |
| 6,469,438 B2 | 10/2002 | Fukuoka et al. |
| 6,492,778 B1 | 12/2002 | Segawa |
| 6,515,310 B2 | 2/2003 | Yamazaki |
| 6,541,918 B1 | 4/2003 | Yudasaka |
| 6,614,174 B1 | 9/2003 | Urabe |
| 6,680,577 B1 | 1/2004 | Inukai |
| 6,716,662 B2 | 4/2004 | Akai |
| 6,734,671 B2 | 5/2004 | Murata |
| 6,794,278 B2 | 9/2004 | Kido et al. |
| 6,833,560 B2 | 12/2004 | Konuma et al. |
| 6,836,070 B2 | 12/2004 | Chung |
| 6,844,210 B2 | 1/2005 | Fukuoka et al. |
| 6,852,997 B2 | 2/2005 | Yamazaki et al. |
| 6,897,607 B2 | 5/2005 | Sugimoto et al. |
| 6,906,458 B2 | 6/2005 | Kobayashi |
| 6,909,409 B2 | 6/2005 | Tanada |
| 6,911,163 B2 | 6/2005 | Abe |
| 7,015,640 B2 | 3/2006 | Schaepkens et al. |
| 7,057,208 B2 | 6/2006 | Akimoto |
| 7,125,503 B2 | 10/2006 | Abe |
| 7,132,693 B2 | 11/2006 | Konuma et al. |
| 7,183,580 B2 | 2/2007 | Hayashi et al. |
| 7,294,517 B2 | 11/2007 | Takayama et al. |
| 7,488,986 B2 | 2/2009 | Yamazaki et al. |
| 7,492,090 B2 | 2/2009 | Yamazaki et al. |
| 7,732,824 B2 | 6/2010 | Konuma et al. |
| 2002/0038889 A1* | 4/2002 | Yamazaki et al. ............ 257/347 |
| 2002/0053871 A1 | 5/2002 | Seo |
| 2002/0093285 A1 | 7/2002 | Sugimoto |
| 2002/0098628 A1 | 7/2002 | Hamada et al. |
| 2002/0113241 A1 | 8/2002 | Kubota |
| 2002/0134981 A1 | 9/2002 | Nakamura et al. |
| 2002/0153831 A1 | 10/2002 | Sakakura |
| 2003/0017360 A1* | 1/2003 | Tai et al. ....................... 428/690 |
| 2003/0111666 A1 | 6/2003 | Nishi et al. |
| 2003/0117070 A1* | 6/2003 | Komatsu et al. ............. 313/506 |
| 2003/0127651 A1 | 7/2003 | Murakami et al. |
| 2003/0146439 A1 | 8/2003 | Yamazaki et al. |
| 2003/0164496 A1 | 9/2003 | Do et al. |
| 2003/0164674 A1 | 9/2003 | Imamura |
| 2003/0184221 A1 | 10/2003 | Mishima |
| 2003/0184222 A1 | 10/2003 | Nilsson et al. |
| 2003/0193056 A1 | 10/2003 | Takayama et al. |
| 2003/0235935 A1 | 12/2003 | Yamazaki |
| 2004/0004434 A1 | 1/2004 | Nishi |
| 2004/0021415 A1 | 2/2004 | Vong |
| 2004/0027507 A1 | 2/2004 | Iwakabe |
| 2004/0029338 A1 | 2/2004 | Yamazaki |
| 2004/0048100 A1 | 3/2004 | Ebisawa et al. |
| 2004/0066137 A1 | 4/2004 | Hayashi |
| 2004/0135151 A1 | 7/2004 | Okamoto |
| 2005/0082966 A1 | 4/2005 | Yamazaki |
| 2005/0084994 A1 | 4/2005 | Yamazaki |
| 2005/0093432 A1 | 5/2005 | Yamazaki |
| 2005/0110020 A1 | 5/2005 | Hayashi |
| 2005/0156519 A1 | 7/2005 | Yoshizawa et al. |
| 2005/0224766 A1 | 10/2005 | Abe |
| 2005/0224803 A1 | 10/2005 | Yamazaki et al. |
| 2005/0242714 A1 | 11/2005 | Chung |
| 2005/0253131 A1 | 11/2005 | Kobayashi |
| 2005/0269943 A1 | 12/2005 | Hack |
| 2006/0061268 A1 | 3/2006 | Nakanishi |
| 2006/0065894 A1 | 3/2006 | Jung et al. |
| 2007/0164671 A1 | 7/2007 | Yamazaki et al. |

FOREIGN PATENT DOCUMENTS

| | | |
|---|---|---|
| EP | 1093322 A1 | 4/2001 |
| EP | 1128436 A1 | 8/2001 |
| EP | 1 261 042 A1 | 11/2002 |
| EP | 1376713 A1 | 1/2004 |
| EP | 1492387 A1 | 12/2004 |
| EP | 2 262 032 A2 | 12/2010 |
| JP | 2000-012234 | 1/2000 |
| JP | 2000-223272 A | 8/2000 |
| JP | 2000-223275 A | 8/2000 |
| JP | 2000-268954 | 9/2000 |
| JP | 2001-076874 A | 3/2001 |
| JP | 2001-076882 A | 3/2001 |
| JP | 2001-312223 A | 11/2001 |
| JP | 3257913 | 2/2002 |
| JP | 2002-124381 A | 4/2002 |
| JP | 2002-169158 A | 6/2002 |
| JP | 2002-175879 A | 6/2002 |
| JP | 2002-231443 A | 8/2002 |
| JP | 2002-332567 A | 11/2002 |
| JP | 2003-077651 A | 3/2003 |
| JP | 2003-105532 A | 4/2003 |
| JP | 2003-114626 A | 4/2003 |
| JP | 2003-168556 A | 6/2003 |
| JP | 2003-203783 A | 7/2003 |
| JP | 2003-297551 A | 10/2003 |
| JP | 2003-297554 A | 10/2003 |
| JP | 2003-297575 A | 10/2003 |
| JP | 2004-087451 | 3/2004 |
| KR | 2001-0052605 A | 6/2001 |
| WO | 00/60905 A1 | 10/2000 |

OTHER PUBLICATIONS

Office Action, Chinese Application No. 200410098142.2, dated Sep. 7, 2007, 28 pages with English translation.

Office Action, Japanese Application No. 2004-299587, dated May 11, 2010, 6 pages with English translation.

Office Action, Korean Application No. 2004-0068687, dated Feb. 1, 2011, 11 pages with English translation.

\* cited by examiner

ITSO
Quarter substrate ID; CF0933, Mask type; TP32E

| Substrate No. | Luminance (cd) | Current (mA) |
|---|---|---|
| 4B−E1 | — | |
| 4B−D2 | 150 | 25.5 |
| 4B−E3 | - | |
| 4B−D4 | 140 | 25.6 |
| 4B−E5 | 96.8 | 26.2 |
| Average | 130 | |

Fig. 2A

ITO
Quarter substrate ID; CE1757, Mask type; TP32E

| Substrate No. | Luminance (cd) | Current (mA) |
|---|---|---|
| 8B−E1 | 100 | 29 |
| 8B−D2 | 99.8 | 27.6 |
| 8B−E3 | 97.1 | 27.3 |
| 8B−D4 | 104 | 28.3 |
| 8B−E5 | 92.3 | 25.7 |
| Average | 98.6 | |

Fig. 2B

Date of deposition: Jul. 30, 2003

| Anode | Lot No. | Panel position | $C^{*1}$ | $L^{*2}$ | $L/C^{*3}$ |
|---|---|---|---|---|---|
| ITSO | CF 1152 | 11D | E1 | 25.1 | 138.0 | 5.498 |
| | | | D2 | 27.8 | 159.0 | 5.719 |
| | | | E3 | 29.4 | 172.0 | 5.850 |
| | | | D4 | 29.9 | 154.0 | 5.151 |
| | | | E5 | 26.6 | 140.0 | 5.263 |
| | CF 1152 | 04D | E1 | 24.5 | 118.0 | 4.816 |
| | | | D2 | 30.3 | 158.0 | 5.215 |
| | | | E3 | 31.8 | 163.0 | 5.126 |
| | | | D4 | 29.8 | 146.0 | 4.899 |
| | | | E5 | 27.1 | 129.0 | 4.760 |
| | CF 0933 | 04D | E1 | 24.8 | 160.0 | 6.452 |
| | | | D2 | 26.7 | 174.0 | 6.517 |
| | | | E3 | 30.0 | 196.0 | 6.533 |
| | | | D4 | 27.0 | 161.0 | 5.963 |
| | | | E5 | 24.8 | 142.0 | 5.726 |
| | CF 0933 | 04B | E1 | | | |
| | | | D2 | 25.5 | 155.0 | 6.078 |
| | | | E3 | 43.0 | | |
| | | | D4 | 25.6 | 140.0 | 5.469 |
| | | | E5 | 26.2 | 96.8 | 3.695 |
| | max | | | | 196.0 | 3.695 |
| | min | | | | 96.8 | 6.533 |
| | average | | | | 150.6 | 5.531 |
| ITO | CE 1762 | 05D | E1 | 31.3 | 127.0 | 4.058 |
| | | | D2 | | | |
| | | | E3 | 29.9 | 119.0 | 3.980 |
| | | | D4 | 32.5 | 128.0 | 3.938 |
| | | | E5 | 29.8 | 115.0 | 3.859 |
| | CE 1762 | 02D | E1 | 31.5 | 117.0 | 3.714 |
| | | | D2 | 29.9 | 110.0 | 3.679 |
| | | | E3 | 30.6 | 119.0 | 3.889 |
| | | | D4 | 30.7 | 116.0 | 3.779 |
| | | | E5 | 28.9 | 111.0 | 3.841 |
| | CE 1757 | 08D | E1 | 29.0 | 100.0 | 3.448 |
| | | | D2 | 27.6 | 99.8 | 3.616 |
| | | | E3 | 27.3 | 97.1 | 3.557 |
| | | | D4 | 28.3 | 104.0 | 3.675 |
| | | | E5 | 25.7 | 92.3 | 3.591 |
| | CE 1757 | 01D | E1 | 28.5 | 164.0 | 5.754 |
| | | | D2 | 27.5 | 100.0 | 3.636 |
| | | | E3 | 27.5 | 100.0 | 3.636 |
| | | | D4 | 27.8 | 101.0 | 3.633 |
| | | | E5 | 25.7 | 95.8 | 3.728 |
| | max | | | | 164.0 | 3.448 |
| | min | | | | 92.3 | 5.754 |
| | average | | | | 109.4 | 3.753 |

Date of deposition: Aug. 6, 2003

| Anode | Lot No. | Panel position | $C^{*1}$ | $L^{*2}$ | $L/C^{*3}$ |
|---|---|---|---|---|---|
| ITSO | CF 1153 | 01B | E1 | 1.48 | 6.7 | 4.527 |
| | | | D2 | 1.35 | 7.1 | 5.259 |
| | | | E3 | 2 | 1.9 | 0.950 |
| | | | D4 | 3.2 | 6.6 | 2.063 |
| | | | E5 | 0.2 | | |
| | CF 1502 | 03C | E1 | 3.18 | 13.6 | 4.277 |
| | | | D2 | 3.4 | 15.5 | 4.559 |
| | | | E3 | 4.02 | 19.5 | 4.851 |
| | | | D4 | 4.8 | 22.3 | 4.627 |
| | | | E5 | 8.6 | 41.5 | 4.826 |
| | CF 1503 | 02D | E1 | 24.9 | 107.0 | 4.297 |
| | | | D2 | 30 | 135.0 | 4.500 |
| | | | E3 | 31.1 | 139.0 | 4.469 |
| | | | D4 | 30.7 | 140.0 | 4.560 |
| | | | E5 | 29 | 133.0 | 4.586 |
| | CF 2211 | 01D | E1 | 36 | 198.0 | 5.500 |
| | | | D2 | 30 | 171.0 | 5.700 |
| | | | E3 | 30.3 | 177.0 | 5.842 |
| | | | D4 | 30.9 | 170.0 | 5.502 |
| | | | E5 | 28.4 | 156.0 | 5.493 |
| | max | | | | 198.0 | 0.950 |
| | min | | | | 1.9 | 5.842 |
| | average | | | | 85.9 | 4.682 |

$C^{*1}$ Current $L^{*2}$ Luminance $L/C^{*3}$ Luminance/Current

Fig. 3

Comparison of efficiency in the deposition substrate in July 30

・Average is cariculated without maximum value and minimum value.

・Efficiency of ITSO is 1.47 times higher than that of ITO.

LIGHT EMITTING ELEMENT AND MANUFACTURING METHOD THEREOF

BACKGROUND OF THE INVENTION

1. Field of the Invention

The present invention relates to a light emitting element using an electroluminescent material. Specifically, the invention relates to an element structure of a light emitting element in which a pair of electrodes and an organic compound layer therebetween are stacked.

2. Description of the Related Art

A light emitting element in which electroluminescence (hereinafter also referred to as EL) is produced by using a pair of electrodes sandwiching mainly a layer containing an organic compound has been attracting attention. The light emitting element uses a phenomenon below; a hole injected from one electrode and an electron injected from the other electrode recombine to excite luminescence center, thereafter light is emitted when luminescence center back to a ground state. That is, the light emitting element is formed so that organic compounds with different carrier transport characteristics are stacked between a pair of electrodes, and holes are injected from one of the electrodes and electrons are injected from the other electrode. The degree of a work function of a material for forming an electrode is regarded as an indicator of hole and electron injection characteristics into an organic compound. A material having high work function is preferable for an electrode where holes are injected, and a material having low work function is preferable for an electrode where electrons are injected.

Conventionally, indium tin oxide (ITO) having a work function of about 5 eV is used for an electrode where holes are injected, which is called an anode, and the anode has been made to contact an organic compound with high hole transport characteristics. Meanwhile, a material in which alkali metal or alkaline earth metal such as Li or Mg is contained in aluminum or the like is used for an electrode where electrons are injected, which is called a cathode, and the cathode has been made to contact a material with high electron transport characteristics.

The organic compound is used for other than a hole injection layer formed of copper phthalocyanine (CuPc), a hole transport layer formed of 4,4'-bis [N-(naphthyl)-N-phenyl-amino] biphenyl (α-NPD) which is an aromatic amine material, and an electron injection layer or an electron transport layer of a tris-8-quinolinolate aluminum complex (Alq3); a light emitting layer in which a guest material such as quinacridone is added to a light emitting material such as $Alq_3$ and rubrene or a host material.

It is required to improve the characteristics of a light emitting element that electrons and holes are efficiently injected from electrodes, the injected charges are efficiently transported to a light emitting layer, efficiency of recombination of electrons and holes is increased, and the emission efficiency after the recombination is improved.

However, in the case of a light emitting device having a conventional structure in which an organic compound is stacked over an electrode formed of an inorganic compound, sufficient luminance can not be obtained. Further, such a light emitting element has problems to be solved with respect to stability such as high power consumption and short half life of luminance.

BRIEF SUMMARY OF THE INVENTION

The present invention has been made in view of the above problems and it is an object of the invention to provide a light emitting element with high stability, good light emission characteristics, and high luminance with low power consumption.

The invention provides a light emitting element in which an insulating or semi-insulating barrier layer where a tunnel current flows is provided between an electrode (anode) where holes are injected (hereinafter referred to as a hole injection electrode) and a layer containing an organic compound with hole transport characteristics (a hole injection layer or a hole transport layer). Specifically, the invention provides a light emitting element in which a thin insulating or semi-insulating barrier layer which contains silicon or silicon oxide and a light transmitting conductive oxide material is interposed between a light transmitting conductive oxide film typified by ITO and a hole injection layer containing an organic compound. Instead of the above barrier layer, a thin insulating or semi-insulating barrier layer which contains carbon in addition to silicon or silicon oxide, and a light transmitting conductive oxide material may be interposed.

As to a light emitting element according to the invention, a hole injection electrode is formed with a light transmitting conductive oxide layer containing silicon or silicon oxide; a hole injection layer or a hole transport layer is formed of an organic compound; and an insulating or semi-insulating barrier layer in which a tunnel current flows through is provided between the hole injection electrode and the hole injection layer or hole transport layer.

As to a light emitting element according to the invention, a hole injection electrode is formed with a light transmitting conductive oxide layer containing silicon or silicon oxide; a hole injection layer or a hole transport layer is formed of an organic compound, and an insulating or semi-insulating barrier layer which improves hole injection efficiency is provided between the hole injection electrode and the hole injection layer or hole transport layer.

As to a light emitting element according to the invention, a hole injection electrode is formed with a light transmitting conductive oxide layer containing silicon or silicon oxide; a hole injection layer or a hole transport layer is formed of an organic compound; and an insulating or semi-insulating barrier layer in which a tunnel current flows through is provided to prevent the hole injection electrode and the hole injection layer or hole transport layer from contacting each other.

As to a light emitting element according to the invention, a hole injection electrode is formed with a light transmitting conductive oxide layer containing silicon or silicon oxide; a hole injection layer or a hole transport layer is formed of an organic compound; and an insulating or semi-insulating barrier layer which layer improves hole injection efficiency is provided to prevent the hole injection electrode and the hole injection layer or hole transport layer from contacting each other.

As to a light emitting element according to the invention, a hole injection electrode is formed with a light transmitting conductive oxide layer containing silicon or silicon oxide; a hole injection layer or a hole transport layer is formed of an organic compound; and a barrier layer containing the silicon or silicon oxide is provided on the surface of the hole injection electrode between the hole injection electrode and the hole injection layer or hole transport layer.

As to a light emitting element according to the invention, a hole injection electrode is formed with a light transmitting conductive oxide layer containing silicon or silicon oxide; a hole injection layer or a hole transport layer is formed of an organic compound; and a barrier layer containing the silicon or silicon oxide is provided on the surface of the hole injection electrode to prevent the hole injection electrode and the hole injection layer or hole transport layer from contacting each other.

The invention includes the steps of: forming an insulating or semi-insulating barrier layer in which a tunnel current flows through on the surface of a hole injection electrode formed with a light transmitting conductive oxide layer containing silicon or silicon oxide; and forming a hole injection layer or a hole transport layer, either of which is formed of an organic compound over the barrier layer.

The invention includes the steps of: forming an insulating or semi-insulating barrier layer which improves hole injection efficiency, on the surface of a hole injection electrode formed with a light transmitting conductive oxide layer containing silicon or silicon oxide; and forming a hole injection layer or a hole transport layer, either of which is formed of an organic compound over the barrier layer.

The invention includes the steps of: forming a hole injection electrode with indium tin oxide containing silicon or silicon oxide; forming a barrier layer on the surface of the hole injection electrode by selectively removing the indium tin oxide so as to have the silicon or silicon oxide left; and forming a hole injection layer or a hole transport layer formed of an organic compound over the barrier layer.

The invention includes the steps of: forming a conductive layer of a light transmitting conductive oxide layer containing silicon or silicon oxide over an insulating surface; performing exposure to perform development so as to remove an unexposed portion after the conductive layer is coated with a photosensitive organic resin material; forming an organic resin layer having an opening in which the hole injection electrode is exposed; and forming a hole injection layer formed of an organic compound over the conductive layer after a heat treatment.

A light transmitting conductive oxide layer may use a light transmitting conductive oxide material such as indium tin oxide (ITO), zinc oxide (ZnO), indium zinc oxide (IZO), zinc oxide added with gallium (GZO), or the like. It is preferable to form a hole injection electrode by sputtering the target containing the light transmitting conductive oxide material and silicon oxide.

As to the light emitting element configured as above, the hole injection electrode and the hole injection layer does not directly contact each other. Accordingly, the original work function of the hole injection electrode can be acquired, and the efficiency of hole injection into the hole injection layer is improved; thus, light emission characteristics can be enhanced.

BRIEF DESCRIPTION OF THE DRAWING

FIGS. 2A and 2B are tables which show a laboratory results of display of a light emitting devices according to this embodiment and a comparative example.

FIG. 3 is a table which shows laboratory results of display of a light emitting device according to this embodiment and a comparative example.

DETAILED DESCRIPTION OF THE INVENTION

Embodiment Mode

Figure 1A:
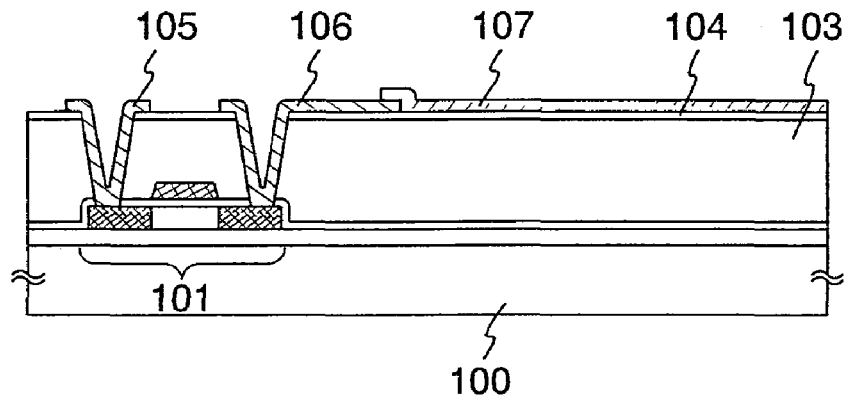
FIGS. 1A to 1C are figures which describe a manufacturing method of a light emitting device using a light emitting element according to the invention.

An embodiment mode of the present invention will be described in details using the accompanying drawings. The present invention is not limited to the description below. It is easily understood by those skilled in the art that embodiment modes and details of the invention can be variously changed without departing from the spirit and scope of the invention. The invention is not to be construed as limited to the description of the embodiment mode below. In the modes to be described below, reference numerals denoting the same parts are commonly used in different drawings.

A light emitting element having a structure in which a hole injection electrode formed of a light transmitting conductive oxide layer and an electrode (cathode) having electron injection characteristics, which contains alkali metal or alkaline earth metal (herein after referred to as an electron injection electrode) are stacked with a layer containing an organic compound which generates EL therebetween. The layer containing an organic compound is preferably a stack including a hole transport layer, a light emitting layer, and an electron transport layer. Further, a hole injection layer may be provided between a hole injection electrode and a hole transport layer. An electron injection electrode may be provided between an electron injection electrode and an electron transport layer. It is not necessarily that difference between hole injection layer and hole transport layer, and electron injection layer and electron transport layer is exact, these are same in respect that hole transport characteristic (a mobility of hole) or electron characteristic (a mobility of electron) is especially important. A structure in which a hole blocking layer is provided between an electron transport layer and a light emitting layer may be used. The light emitting layer may have a structure in which a guest material such as a pigment or a metal complex is added to a host material to change the emission colors. Accordingly, the light emitting layer may be formed so as to contain a phosphorescent or a fluorescent material.

A layer containing an organic compound or an organic compound layer includes a hole injection layer, a hole transport layer, a light emitting layer, an electron transport layer, and an electron injection layer in view of carrier transport characteristics. It is not necessarily that difference between hole injection layer and hole transport layer is exact, so the hole injection layer and the hole transport layer are same in respect that a hole transport characteristic (a mobility of hole) is especially important. A layer in contact with a hole injection layer is called a hole transport layer for convenience so as to be distinguished from the hole injection layer that is in contact with an anode. Similarly, a layer in contact with a cathode is called an electron injection layer, and a layer in contact with the electron injection is called an electron transport layer. Occasionally, a light emitting layer also serves as an electron transport layer; accordingly, such a light emitting layer is called as a light emitting electron transport layer. Further, a light emitting element can use various materials instead of an organic compound, such as a material which is a complex of an organic material and an inorganic material, a material in which a metal complex is added to an organic compound, or the like as long as the similar function can be obtained.

A hole injection electrode is made with a light transmitting conductive oxide layer which is selected from the group consist of as indium oxide tin (ITO), zinc oxide (ZnO), indium zinc oxide (IZO), zinc oxide added with gallium (GZO), or the like, and which is added with 1 atom % to 10 atom % of silicon oxide. Preferably, the concentration of silicon oxide on the surface where the hole injection electrode is in contact with an organic compound is increased; thus, an insulating or semi-insulating barrier layer may be formed on the surface of the hole injection electrode. The barrier layer have a thickness where carriers can move between the hole injection electrode and the organic compound layer.

Alternatively, a barrier layer made of silicon oxide or a complex of silicon oxide and a light emitting conductive oxide layer is formed to a thickness where current can be flowed by a tunnel current. The barrier layer has a composition different from the hole injection electrode that serves as a base. Accordingly, the barrier layer exhibits (non-rectification characteristic) even when it is interposed between the hole injection layer and the organic compound layer. The barrier layer enables carriers to move and also separates the hole injection electrode and the organic compound layer. When a barrier layer is provided, the hole injection electrode and the organic compound layer are made not to contact directly. In such a structure, the original work function of a hole injection electrode can be exerted. Thus, the efficiency of hole injection into the organic compound layer is improved, and the emission characteristics can be enhanced.

A hole injection electrode formed with a light transmitting conductive oxide layer can be formed by sputtering using a target containing the light transmitting conductive oxide material and silicon oxide. The target may have a silicon oxide content of 1 wt % to 20 wt % in the light transmitting conductive oxide layer, preferably, 2 wt % to 10 wt %. When the concentration of silicon oxide is increased, the resistivity of the hole injection electrode is increased; accordingly, the hole injection electrode may be formed in the above range. Thus, the hole injection electrode in which silicon of 1 wt % to 20 wt %, preferably, 2 wt % to 10 wt % is contained in a light transmitting conductive oxide layer is obtained. The hole injection electrode may be formed by depositing a light transmitting conductive oxide material and silicon oxide by vacuum co-deposition as long as the similar composition can be obtained.

The barrier layer can be formed by selectively removing a light transmitting conductive oxide material from a light transmitting conductive oxide layer containing silicon oxide. Specifically, the barrier layer can be formed by raising the component ratio of silicon oxide added to the light transmitting conductive oxide layer. One of the formation methods is a method in which the surface of the light transmitting conductive oxide layer is treated with a solution which can selectively remove the light transmitting conductive oxide material. Other than that, a barrier layer can be formed on the surface of the light transmitting conductive oxide layer by plasma treatment using one or more selected from hydrogen, oxygen, and fluorine, or by plasma treatment using an inert gas such as nitrogen or argon. The insulating or semi-insulating barrier layer may be a coating of silicon or silicon oxide formed over the light transmitting conductive oxide layer by vacuum deposition, sputtering, or a vapor phase crystal growth method. Further, the barrier layer may be a coating formed by spin coating a solution containing silicon or silicon oxide and by baking thereafter. In either case, a barrier layer can be a complex of silicon or silicon oxide and a light transmitting conductive oxide material, or a complex of silicon or silicon oxide, a light transmitting conductive oxide material, and carbon.

A solution of poly (3,4-ethylenedioxythiophene)/poly(styrenesulfonate) (PEDOT: PSS) may be used as a polymer base compound for the hole injection layer, instead of copper phthalocyanine (CuPc); 4,4'-bis-[N-(naphthyl)-N-phenyl-amino] biphenyl (α-NPD) which is an aromatic amine material; or 4,4',4"-tris [N-3-methylphenyl-N-phenyl-amino] triphenylamin (MTDATA). Such a hole injection layer may be formed by vacuum deposition or spin coating.

Before the hole injection layer is formed, the hole injection electrode may be heat treated at a temperature of from 100° C. to 300° C., or may be wiped for the purpose of purification to improve planarity.

The barrier layer is sometimes difficult to be formed in the case where the light transmitting conductive oxide layer is formed finely. The barrier layer is preferably formed coarsely to some extent at the submicron level. Specifically, in forming a resist resin formed in contact with the light transmitting conductive oxide layer when the light transmitting conductive oxide layer is patterned, and forming an organic resin layer thereover, the barrier layer can be formed by combining a metal oxide, silicon oxide, and a carbonaceous material which are components of the light transmitting conductive oxide material.

A light emitting element configured as above can exert the effect of the original work function of the hole injection electrode since a hole injection electrode does not directly contact a hole injection layer or a hole transport layer which is an organic compound. The efficiency of hole injection into the hole injection layer is improved since efficiency in the use of carriers is improved; thus, light emission characteristics can be enhanced.

Figure 5:
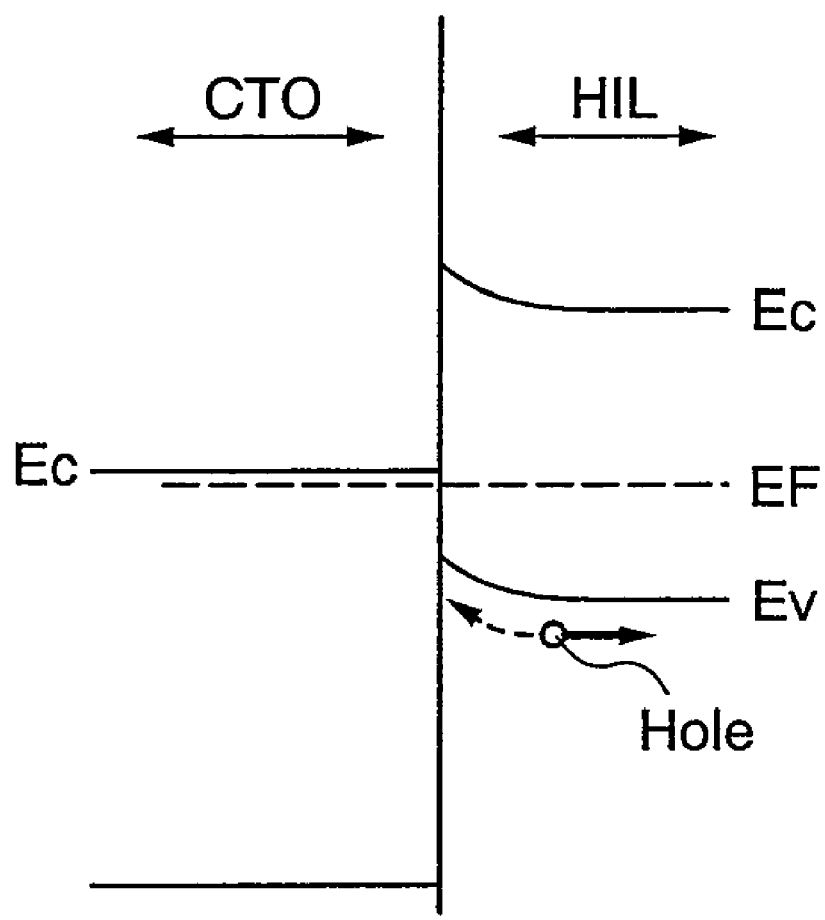
FIG. 5 is a figure showing a band model of contact between a conventional light transmitting conductive oxide layer and a hole injection layer.

FIG. 5 shows a band model of contact between a conventional light transmitting conductive oxide layer (hereinafter also referred to as CTO) and a hole injection layer (HIL). When firm contact is not obtained between the CTO and HIL, the band of the hole injection layer bends due to interface potential so as to make a barrier against electrons. Accordingly, holes are accumulated in the vicinity of the interface. Then, the work function of the light transmitting conductive oxide layer is changed (is reduced) according to the state of contamination of the surface. In such a case, the hole injection characteristics are reduced and a proportion of contribution of injected holes toward light emission is reduced; thus, the current efficiency is also reduced.

Figure 6A:
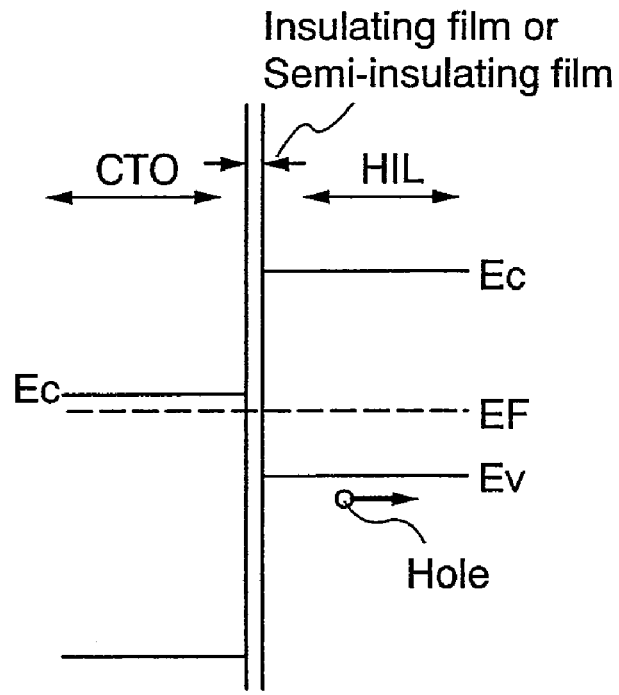
FIGS. 6A and 6B are diagrams showing band models which explain each state where an insulating or semi-insulating barrier layer containing silicon or silicon oxide is formed at a boundary between light transmitting conductive oxide layer and a hole injection layer.
Figure 6B:
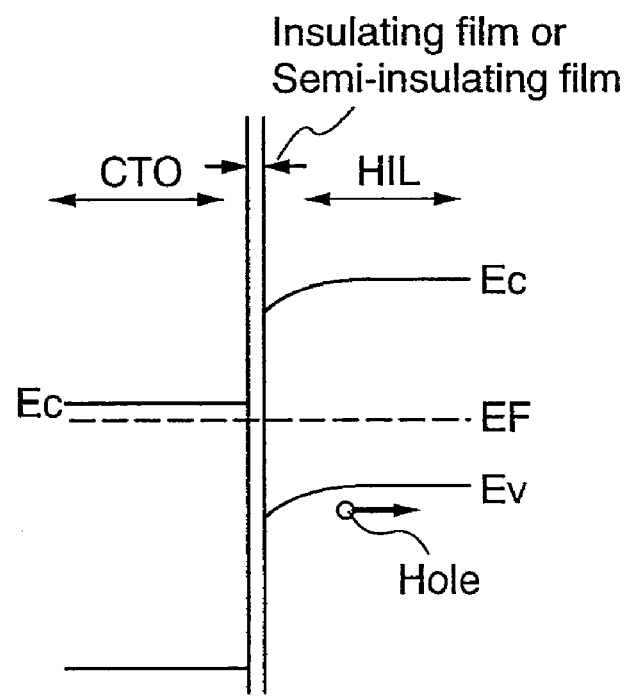

FIGS. 6A and 6B each show a state where an insulating or semi-insulating barrier layer containing silicon or silicon oxide is formed at the interface between CTO and HIL. A barrier layer is thick enough for carriers to tunnel; the thickness is 0.5 nm to 5 nm. The barrier layer planarizes the band as shown in FIG. 6A, or bends the band downside so as not to accumulate holes as shown in FIG. 6B. Thus, the hole injection characteristics is improved with the function of the barrier layer. Further, the proportion of contribution of the injected holes toward light emission can be improved.

Next, a method for manufacturing a light emitting device using a light emitting element according to the invention will be described with reference to FIGS. 1A to 1C. FIG. 1A shows a transistor 101 formed over an element substrate 100. The transistor 101 is a driver transistor for supplying current to a light emitting element which is formed later. The transistor 101 is covered with a first interlayer insulating film 103 and a second interlayer insulating film 104. Further, the transistor 101 is connected to wirings 105 and 106 formed on the second interlayer insulating film 104 through a contact hole formed in the first interlayer insulating film 103 and the second interlayer insulating film 104.

The first interlayer insulating film 103 may be formed with an organic resin film, an inorganic material, or an insulating film containing Si—O bond and Si—CHx crystal using a siloxane material. The second interlayer insulating film 104 may be formed with a film which hardly allows moisture or oxygen to pass through. For example, a silicon nitride film formed by RF sputtering can be used. A diamond like carbon (DLC) film, an aluminum nitride film, or the like may be used alternatively.

After the wirings 105 and 106 are formed, a hole injection electrode 107 is formed. The hole injection electrode 107 can be formed by using a light transmitting conductive oxide film. Preferably, the hole injection electrode 107 is formed of indium tin oxide containing silicon oxide (hereinafter also referred to as "ITSO") obtained by sputtering an ITO target containing 2 wt % to 10 wt % of silicon oxide. Other than ITSO, a light transmitting conductive oxide film containing silicon oxide in which indium tin oxide is mixed with 2% to 20% of zinc oxide (ZnO) can be used.

The hole injection electrode 107 may be polished CMP so that the surface thereof is planarized. After the polishing by CMP, the surface of the hole injection electrode 107 may be treated with UV irradiation, oxygen plasma treatment, or the like. Further, wiping may be performed with a porous body of polyvinyl alcohols. As thus treated, the projections of the hole injection electrode 107 can be eliminated and short circuit in a light emitting element can be avoided. Further, a foreign material remained on the hole injection electrode 107 can be removed effectively.

Figure 1B:
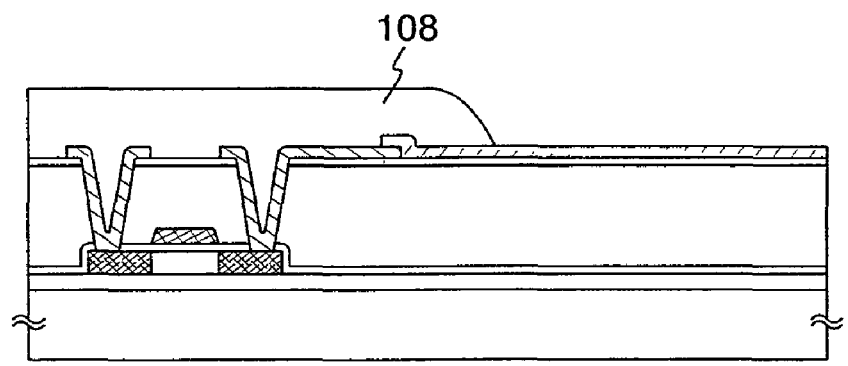

Next, as shown in FIG. 1B, a bank 108 is formed so as to cover wirings 105 and 106, the second interlayer insulating film 104, and a part of the hole injection electrode 107. An organic resin film, an inorganic material, or an insulating film containing Si—O bond and Si—CHx crystal using a siloxane material may be used for the bank 108. The bank 108 has an opening 117, and the hole injection electrode 107 is partially exposed in the opening.

It is desirable that an end portion of the opening of the bank 108 has a curved surface. The end portion of the opening of the bank 108 has a gradual and gentle curve so that the coverage of an organic compound layer 109 at the portion can be improved. The curved surface may have a gradual curvature radius, desirably in the range of 0.2 μm to 2 μm. With the above structure, a coverage of the organic compound 109 formed over the bank 108 can be improved. As a result, short circuit between the hole injection electrode 107 and the electron injection electrode formed over the organic compound layer 109 can be prevented. Further, when the stress of the organic compound layer 109 is alleviated, a defect called shrink by which a light emitting region is diminished can be suppressed, and thus, the reliability can be improved.

FIG. 1B shows an example in which a bank 108 is formed of a positive type photosensitive acrylic resin. In this case, the bank may be formed of a negative type photosensitive acrylic resin alternatively. For example, in the case where the bank 108 is formed of a negative type photosensitive acrylic resin, a sectional shape at the opening is gently curved. The curved shape is preferably a shape with gradual curvature radius. At this time, each curvature radius at the upper and the lower end portions at the opening is desirably in the range of 0.2 μm to 2 μm.

The bank 108 is heated in a vacuum atmosphere in order to remove absorbed moisture and oxygen before forming the organic compound layer 109. Specifically, heat treatment is performed in a vacuum atmosphere at a temperature of from 100° C. to 200° C. and for approximately 0.5 hour to 1 hour. The pressure is desirably set at $4\times10^{-5}$ Pa or less, and if possible, best at $4\times10^{-6}$ Pa or less. The absorbed moisture and oxygen can be removed more effectively by heat treatment under reduced pressure. In the case where the organic compound layer is formed after heat-treating the organic insulating film in a vacuum, the reliability can be further improved by keeping the vacuum atmosphere until immediately before the film formation.

A barrier layer can be formed on a surface of the hole injection electrode 107 by UV irradiation or oxygen plasma treatment between formation of the hole injection electrode 107 and formation of the organic compound layer 109. Either of UV irradiation and oxygen plasma treatment accelerate an oxidative reaction. For example, the barrier layer can be formed by combining a component of a resist resin which is formed in close contact with the hole injection electrode 107 when the hole injection electrode 107 is patterned and a component of the hole injection electrode 107 with UV irradiation or oxygen plasma treatment. Also, the barrier layer can be formed on a surface of the hole injection electrode 107, when the bank 108 is formed over the hole injection electrode.

Figure 1C:
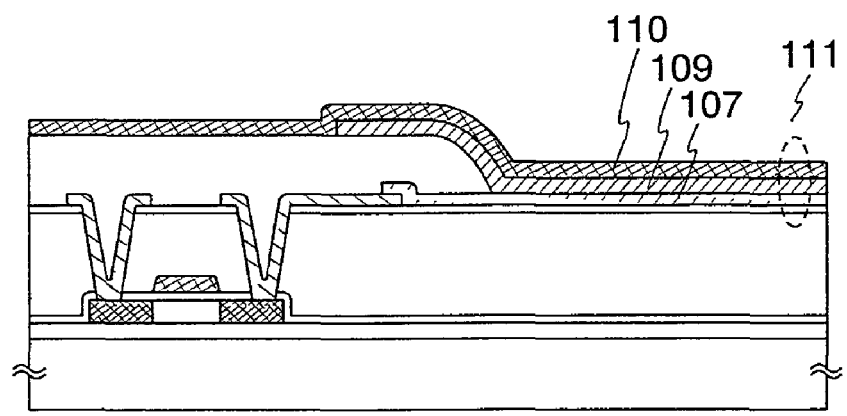

As shown in FIG. 1C, an organic compound layer 109 and an electron injection electrode 110 are sequentially formed over a hole injection electrode 107. The organic compound layer 109 has a structure including a single light emitting layer or a plurality of layers including a light emitting layer which are stacked.

For example, the organic compound layer 109 can be formed by appropriately stacking a hole injection layer, a hole transport layer, a light emitting layer, an electron transport layer, and an electron injection layer. A material with small ionization potential is used for the hole injection layer, and the material can be selected from the group consisting of a metal oxide, a low molecular weight organic compound, and a polymer base compound. As a metal oxide, a vanadium oxide, a molybdenum oxide, ruthenium oxide, aluminum oxide, or the like can be used. As the low molecular organic compounds, a starburst amine typified by m-MTDATA, metallophthalocyanine typified by CuPc, or the like can be used. As a polymer base compound, a conjugated polymer such as polyaniline or polythiophenes can be used. By using the foregoing materials for the hole injection layer, a hole injection barrier is reduced, and thus, holes can be effectively injected into the organic compound layer formed on the side of the light emitting layer.

As the hole transporting layer, known materials such as aromatic amine can be used. For example, 4,4'-bis [N-(1-naphthyl)-N-phenyl-amino]-biphenyl (abbreviated as α-NPD), 4,4,4"-tris(N,N-diphenyl-amino)-triphenyl amine (abbreviated as TDATA), or the like can be used. Alternatively, poly(vinyl carbazole) having excellent hole transport characteristics among high molecular weight materials can be used.

A metal complex such as tris (8-quinolinolate) aluminum (abbreviated as $Alq_3$), tris (4-methyl-8-quinolinolate) aluminum (abbreviated as $Almq_3$), bis (10-hydroxybenzo [η]- quinolinato) beryllium (abbreviated as BeBq$_2$), bis (2-methyl-8-quinolinolate)-(4-hydroxy-biphenylyl)-aluminum (abbreviated BAlq), bis [2-(2-hydroxyphenyl)-benzooxazolate] zinc (abbreviated as Zn(BOX)$_2$), bis [2-(2-hydroxyphenyl)-benzothiazolate] zinc (abbreviated as Zn(BTZ)$_2$), or the like is effectively used for the light-emitting layer. Alternatively, various types of fluorescent dye can be used. Further, a phosphorescent material such as a platinum octaethylporphyrin complex, a tris(phenylpyridine) iridium complex, or a tris (benzylidene-acetonato) phenanthrene europium complex may also be effectively used. Since a phosphorescent material has longer excitation lifetime than that of a fluorescent material, population inversion, that is, the state where the number of molecules in an excited state is more than that in a ground state, can be crated more easily, which is essential to laser oscillation.

In addition, a light-emitting material can be used as a guest material in the light-emitting layer. Specifically, a material having larger ionization potential and larger band gap than those of a light-emitting material is used as a host material, and a small amount of the above light-emitting material (approximately from 0.001% to 30%) may be mixed into the host material.

As the electron transporting layer, a metal complex having a quinoline skeleton or a benzoquinoline skeleton, or a mixed ligand complex thereof typified by tris(8-quinolinolate) aluminum (abbreviated as Alq$_3$). Alternatively, oxadiazoles such as 2-(4-biphenyl)-5-(4-tert-butylphenyl)-1,3,4-oxadiazole (abbreviated PBD), or 1,3-bis [5-(p-tert-butylphenyl)-1,3,4-oxadiazole-2-yl] benzene (abbreviated as OXD-7), triazoles such as 3-(4-tert-butylphenyl)-4-phenyl-5-(4-biphenylyl)-1,2,4-triazole (abbreviated as TAZ), or 3-(4-tert-butylphenyl)-4-(4-ethylphenyl)-5-(4-biphenylyl) -1,2,4-triazole (abbreviated as p-EtTAZ), phenanthrolines such as bathophenanthroline (abbreviated as BPhen), or bathocuproin (abbreviated as BCP) can be used.

As an electron injection material, an alkali metal or an alkaline earth metal salt such as calcium fluoride, lithium fluoride, or cesium bromide can be used. The electron injection layer may have a structure in which such a metal element is contained in another metal or in an electron transport material.

An electron injection electrode 110 can be formed by vapor deposition using another known conductive material with a low work function. For example, Ca, Al, CaF, MgAg, and AlLi are desirable. A light emitting element 111 is formed in an area in the opening of the bank 108 where the hole injection electrode 107, the organic compound layer 109, and the electron injection electrode 110 are overlapped.

Having formed the electron injection electrode 110, a protective film may be formed so as to cover the light emitting element 111. In this case, the protective film is formed with a film which hardly allows substances which may accelerate deterioration of a light emitting element, such as moisture or oxygen to pass through, compared with other insulating films. Typically, a DLC film, a carbon nitride film, a silicon nitride film formed by RF sputtering, or the like is desirably used for the protective film. A laminate of the film which hardly allows substances such as moisture and oxygen to pass through, and a film which allows substances such as moisture and oxygen to easily pass through compared with the above film may also be used for the protective film.

Further, it is preferable to perform packaging (sealing) with a protective film (a laminated film, a UV curable resin film, or the like) which has high airtightness with little outgas thereby avoiding exposure to the outside air or a light transmitting sealing substrate.

As described, a light emitting device in which light from the light emitting element 111 can be released from the side of the element substrate 100.

Figure 7:
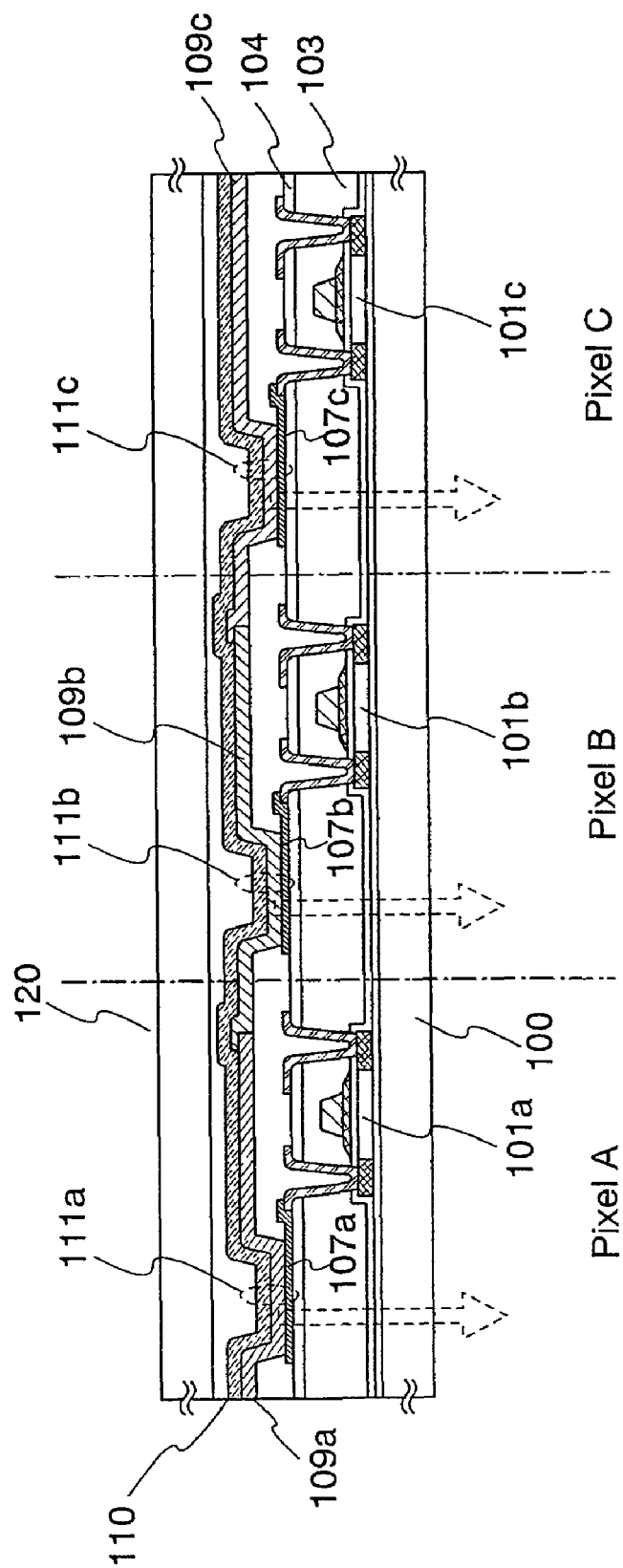
FIG. 7 is a cross-sectional view of a light emitting device having a pixel area including a pixel A, a pixel B, and a pixel C which have different emission colors.

FIG. 7 shows a cross-sectional view of a light emitting device including a pixel area having a pixel A, a pixel B, and a pixel C which emit different colors. In an element substrate 100, the pixel A is provided with a light emitting element 111a connected to a transistor 101a, the pixel B is provided with a light emitting element 111b connected to a transistor 101b, and the pixel C is provided with a light emitting element 111c connected to a transistor 101c.

The transistors and the light emitting elements in FIG. 7 have similar structures to the ones in FIG. 1A to 1C. A first interlayer insulating film 103 and a second interlayer insulating film 104 are formed between layers of the transistor 101a to 101c and the light emitting elements 111a to 111c. Hole injection electrodes 107a to 107c are formed over the second interlayer insulating film 104. The second interlayer insulating film 104 is formed with a silicon nitride film or a silicon oxynitride film. The hole injection electrode 107a is connected with the transistor 101a. The hole injection electrode 107b is connected with the transistor 101b. The hole injection electrode 107c is connected with the transistor 101c.

The light emitting element 111a is formed with the hole injection electrode 107a and the electron injection electrode 110 sandwiching an organic compound layer 109a therebetween. The light emitting element 111b is formed with a hole injection electrode 107b and an electron injection electrode 110 sandwiching an organic compound layer 109b therebetween. The light emitting element 111c is formed with the hole injection electrode 107c and the electron injection electrode 110 sandwiching the organic compound layer 109c therebetween. The structure of the organic compound layers 109a to 109c can be varied corresponding to the emission color of each pixel. Meanwhile, other layers than the light emitting layers, that is, the hole injection layer, the hole transport layer, the electron injection layer, and the electron transport layer may be shared by the pixels A to C.

A sealing substrate 120 is provided opposite the light emitting elements 111a to 111c. The space between the sealing substrate 120 and the element substrate 100 may be filled with a resin or a dried inert gas, or pressure inside the space may be reduced. The transistors 101a to 101c may be formed with thin film transistors. Alternatively, a MOS transistor formed over a single crystal semiconductor substrate or a SOI (Silicon On Insulator) substrate, or a thin film transistor formed with an amorphous semiconductor film of such as silicon can be formed.

Figure 8A:
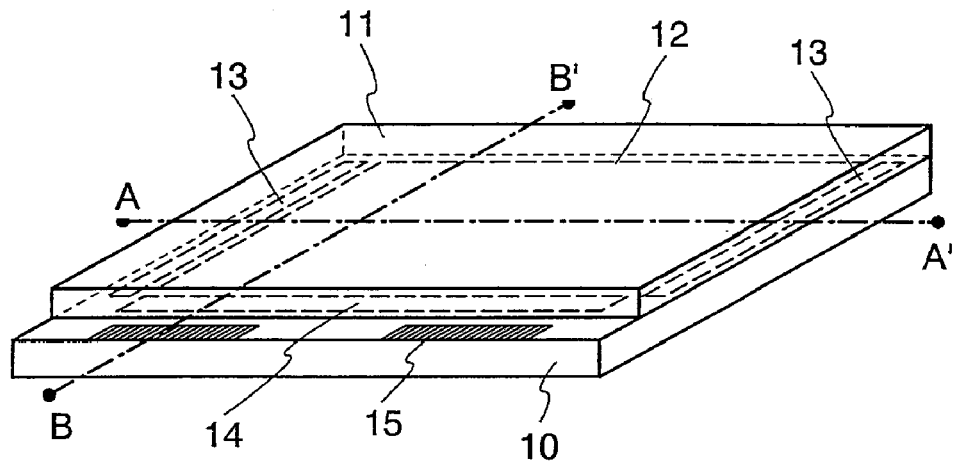
FIGS. 8A to 8C are figures which show a light emitting device in which a counter substrate is integrated with an element substrate.
Figure 8B:
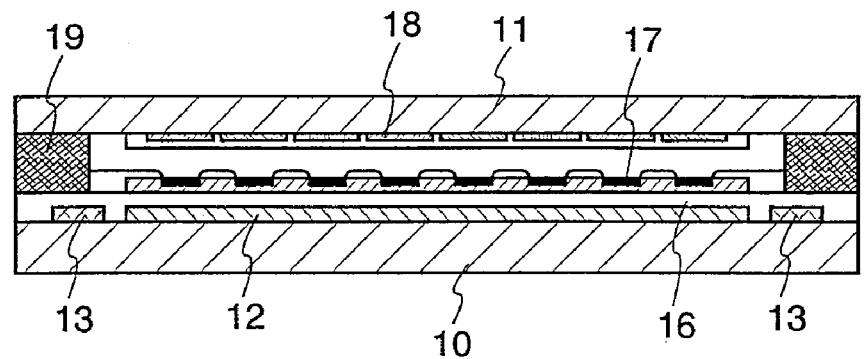
Figure 8C:
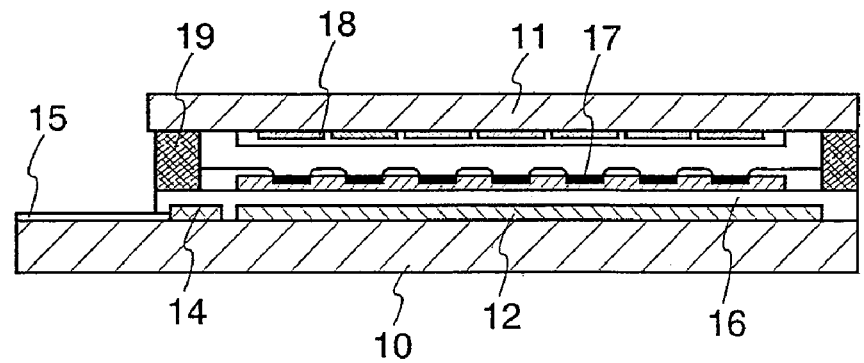

FIGS. 8A to 8C show a light emitting device in which an element substrate 10 and a opposite substrate 11 are integrated. FIG. 8A is a perspective view showing the structure of the light-emitting device without an external circuit or the like. FIG. 8B is a cross-sectional view taken along line A-A' in FIG. 8A. FIG. 8C is a cross-sectional view taken along line B-B' in FIG. 8A.

As shown in the above drawings, the light-emitting device has an element substrate 10 provided with an image display area 12, a scan line driver circuit 13, a data line driver circuit 14, an input terminal 15, and the like. The element substrate 10 is fixed to the counter substrate 11 provided with a color filter 18 with a seal member 19.

Glass, quartz, plastic, or the like is used for the element substrate 10. Glass, quartz, plastic, or the like is used as a member of the counter substrate 11. The substrate can be formed into any shape like such as a plate, a film, or a sheet in a single layer structure or a layered structure. For a glass substrate, light transmitting glass such as commercially available non-alkali glass is preferably used. Alternatively, alkali glass coated with a silicon oxide film can be used. In the case of using plastic, polyethylenenaphthalate (PEN), polyethylene terephthalate (PET), polyether sulfone (PES), transparent polyimide, or the like may be used. In addition, a light transmitting ceramic such as light transmitting alumina or ZnS sintered body can also be used.

The seal member 19 is formed along with the edge of the counter substrate 11. The seal member 19 is formed to overlap with the scan line driver circuit 13 and the data line driver circuit 14 with an interlayer insulating film 16 therebetween in relationship of position to element substrate 10. The interlayer insulating film 16 is formed with a flat surface, and a top surface and a side surface of the interlayer insulating film 16 are formed of silicon nitride or silicon oxynitride.

In the image display area 12, a matrix pattern is formed with data lines and scan lines extended from the scan line driver circuit 13 or the data line driver circuit 14. A pixel matrix is configured with a group of switching elements appropriately placed in position and a group of organic light-emitting elements 17 electrically connected to the group of switching elements. The scan line driver circuit 13 is driven from both sides of the image display area 12 here; however, the scan line driver circuit 13 may be driven from only either side of the image display area 12 if signal delay does not matter.

The input terminal 15 is formed at the periphery of the element substrate 10. The input terminal 15 receives various signals from an external circuit and is connected to a power source. The space surrounded by the element substrate 10, the counter substrate 11, and the seal member 19 is filled with an inert gas. Thus, the group of organic light-emitting elements 17 is protected from corrosion. A desiccant such as barium oxide may be provided in the space.

Figure 9:
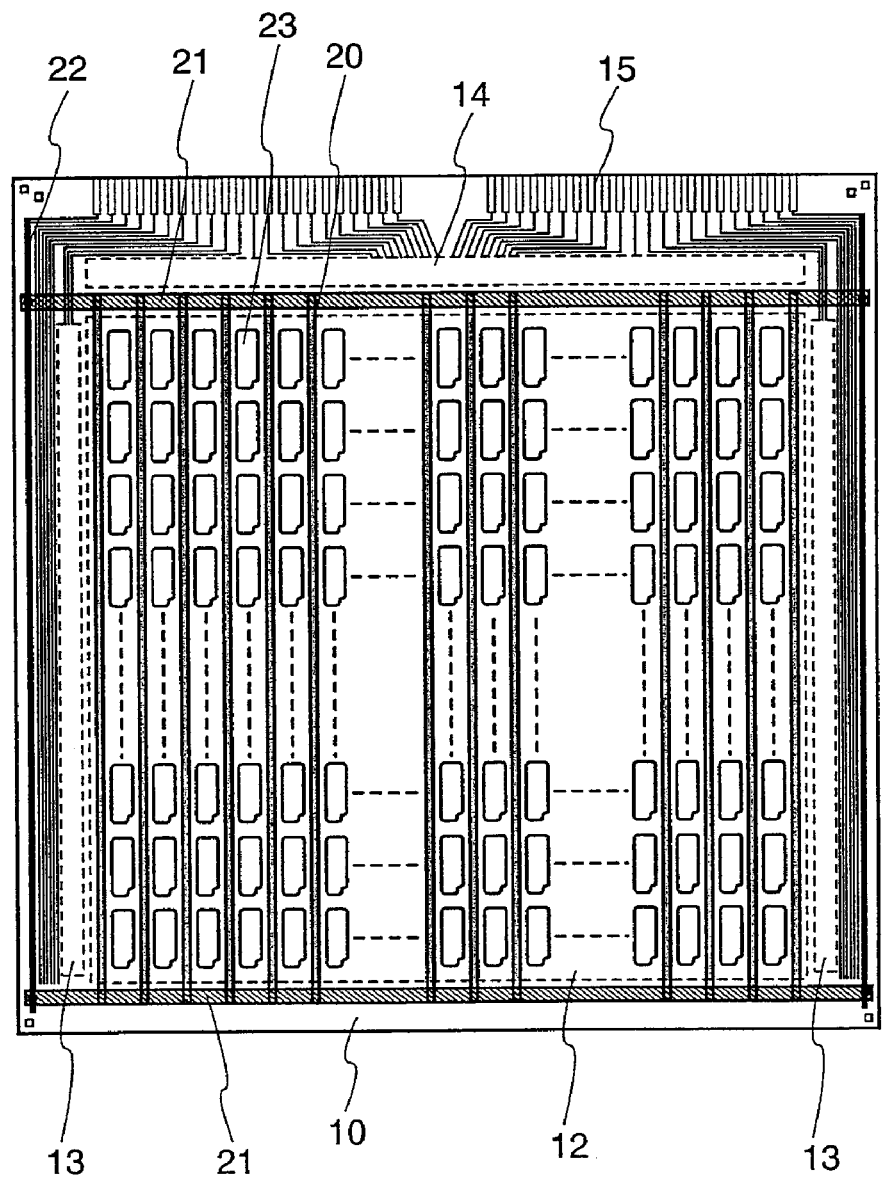
FIG. 9 is a top view showing a structure of an element substrate in more details.

FIG. 9 is a top view which shows a structure of the element substrate 10 in more detail. Specifically, the arrangement of the scan line driver circuit 13 enclosing the two sides of the image display area 12, the data line driver circuit 14 adjacent to other side of the image display area 12, and the input terminal 15 are shown.

A region of one pixel portion 23 which is compartmented in the image display area is arranged in matrix, and rows and columns of the matrix may be regarded apart for convenience. First auxiliary wirings 20 are formed in stripe parallel to columns. Either or both ends of the first auxiliary wirings 20 are extended to the outside of the image display area. The first auxiliary wirings 20 are formed so as not to overlap the a region of one pixel portion 23; thus, the efficiency of taking out the generated light can be kept. Second auxiliary wirings 21 electrically connected to the first auxiliary wirings 20 are extended in parallel with rows. Either or both ends of the second auxiliary wirings 21 are electrically connected to wirings 22 extended from the input terminal 15. A constant potential or alternating potential may be applied to the wirings 22 depending on the driving method of the organic light emitting element.

The auxiliary wirings are preferably formed with a material having resistivity of at most $1 \times 10^{-5}$ $\Omega$cm. The value of resistance of the auxiliary wiring per 1 cm is preferably at most 100$\Omega$. The value of resistance of the auxiliary wirings is determined by line width and thickness besides a material to be used. For example, in the case where the pitch between pixel rows is 200 $\mu$m, the first auxiliary wirings formed over a bank layer are appropriately formed to have a width of from 20 $\mu$m to 40 $\mu$m given that the width of the pixel electrode is approximately 120 $\mu$m. In the case where the auxiliary wirings are formed with an aluminum alloy having resistivity of $4 \times 10^{-6}$ $\Omega$cm to a thickness of 0.4 $\mu$m, the value of resistance is 50$\Omega$ per 1 cm when the line width is 20 $\mu$m.

As to the light emitting element formed as above, the hole injection electrode and the hole injection layer do not directly contact each other. Accordingly, the original work function of the hole injection electrode can be exerted, and the efficiency of hole injection into the hole injection layer is improved; thus, light emission characteristics can be enhanced.

An electronic device equipped with such a light emitting element as device described above includes a television system (also referred to as a merely television or a television receiver), a digital camera, a digital video camera, a cellular phone, a portable information terminal such as a PDA, a game machine, a monitor of a computer, a computer, and a sound playback device such as a car audio system. Examples thereof are shown in FIG. 10.

Figure 10A:
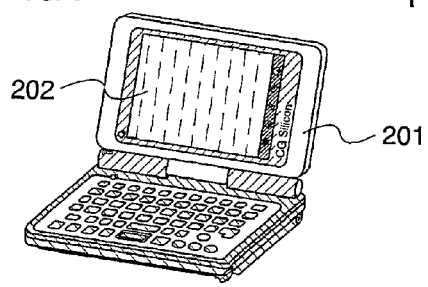
FIGS. 10A to 10F are figures which show examples of electronic devices according to the invention.

In a portable information terminal shown in FIG. 10A, a display area 202 and the like are included in a part of a main body 201. A bright display area can be obtained by forming the display area 202 with a light emitting device of this embodiment mode, and power consumption of the portable information terminal can be reduced.

Figure 10B:
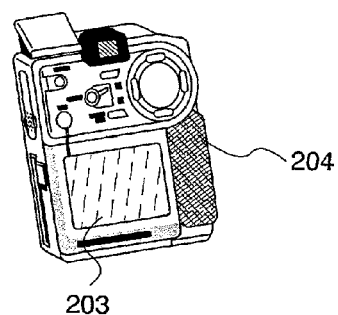

In a digital video camera shown in FIG. 10B, a display area 204 is included in a main body 203. A bright display area can be obtained by forming the display area 204 with a light emitting device of this embodiment mode, and power consumption of the digital video camera can be reduced.

Figure 10C:
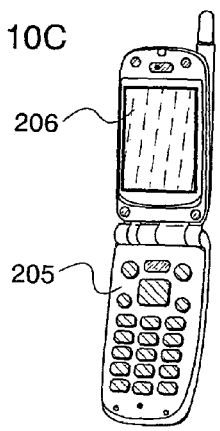

In a cellular phone shown in FIG. 10C, a display area 206 is included in a main body 205. A bright display area can be obtained by forming the display area 206 with a light emitting device of this embodiment mode, and power consumption of the cellular phone can be reduced, and thus, the cellular phone can be used for a longer time.

Figure 10D:
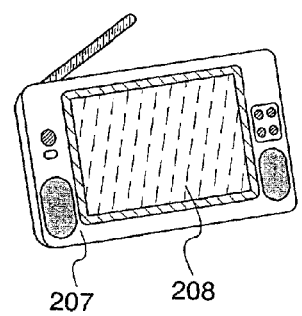

In a game machine shown in FIG. 10D, a display area 208 is included in a main body 207. With this game machine, programs such as a game soft can be downloaded with wireless internet connection. Further, a variety of information can be acquired by mutually communicating with other game machines. A bright display area can be obtained by forming the display area 208 with a light emitting device of this embodiment mode, and the power consumption of the game machine can be reduced, and thus, the game machine can be used for a longer time.

Figure 10E:
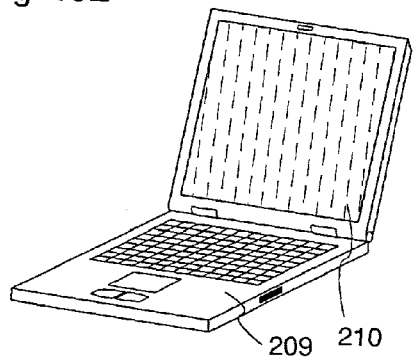

A computer shown in FIG. 10E includes a main body 209 and a display area 210. A bright display area can be obtained by forming the display area 210 with a light emitting device of this embodiment mode, and the power consumption of the computer can be reduced.

Figure 10F:
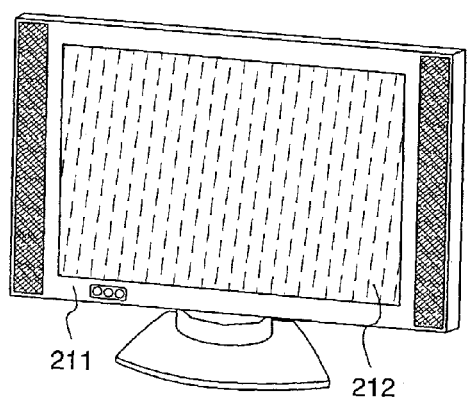

In a television system shown in FIG. 10F, a display area 212 is included in a main body 211. A bright display area can be obtained by forming the display area 212 with a light emitting device of this embodiment mode, the power consumption of the television system can be reduced, and heat generation can be suppressed.

Embodiment 1

A light emitting device manufactured according to this embodiment will be described with reference to FIG. 1. A first interlayer insulating film 103 is formed with silicon oxynitride films. Specifically, the first interlayer insulating film 103 is formed by laminating a 30-nm-thick first silicon oxynitride film and a 200-nm-thick second silicon oxynitride film by plasma CVD to a thickness of 230 nm in total. The second interlayer insulating film 104 is formed with a silicon nitride film with a thickness of 100 nm by sputtering using silicon as a target.

A hole injection electrode 107 is formed with an ITSO film to a thickness of 110 nm by sputtering using a target (934 mm×158 mm) having a composition ratio of 85 wt % indium oxide ($In_2O_3$), 10 tin oxide ($SnO_2$), 5 wt % silicon oxide ($SiO_2$), and a sputtering gas of 120 sccm Ar and 5 sccm oxygen at a pressure of 0.26 Pa and with a DC electrical power of 3.3 kW. The hole injection electrode 107 is formed by patterning the ITSO film to a predetermined shape after a light exposure process. After a photoresist mask is removed, heat treatment is performed at 200° C. for 60 minutes using an oven.

A bank 108 is formed to a thickness of 1500 nm by using a photosensitive acrylic resin. After the acrylic resin is applied by spin coating, baking is performed at an atmospheric temperature of 85° C. for a processing time of 170 seconds. Consequently, the bank 108 is patterned to have a predetermined shape after a light exposure process. Further, heat treatment is performed at 220° C. for 60 minutes using an oven.

Next, ultraviolet ray (UV) irradiation is performed using a mercury lamp as a light source. Further, organic compound layers are formed through heat treatment under reduced pressure at 150° C. for 30 minutes. As to the organic compound layers 109 are formed with CuPc (20 nm) as a hole injection layer, α-NPD (40 nm) as a hole transport layer, $Alq_3$: DMQd (375 nm) as a light emitting layer (DMQd: quinacridones), and $Alq_3$ (375 nm) as an electron transport layer.

An electron injection electrode 110 is formed of calcium fluoride ($CaF_2$) with a thickness of 1 nm, and an aluminum film with a thickness of 200 nm is stacked thereover to form a light emitting element 111.

Comparative Examples

As comparative examples, light emitting devices in which hole injection electrode 107 is formed of ITO is manufactured. An organic compound layer 109 and an electron injection electrode 110 each shall have a similar structure as Embodiment 1.

FIGS. 2A and 2B show laboratory results of display of light emitting devices of this embodiment and of the comparative examples. The both of light emitting devices includes 112200 pixels (size of one pixel is 32 μm×140 μm), and luminance with respect to current when all pixels are turned on to emit light is evaluated. As shown in FIG. 2, the ratio (current efficiency) of luminance with respect to current is extremely larger in a sample of this embodiment using ITSO for the hole injection electrode.

Figure 4:
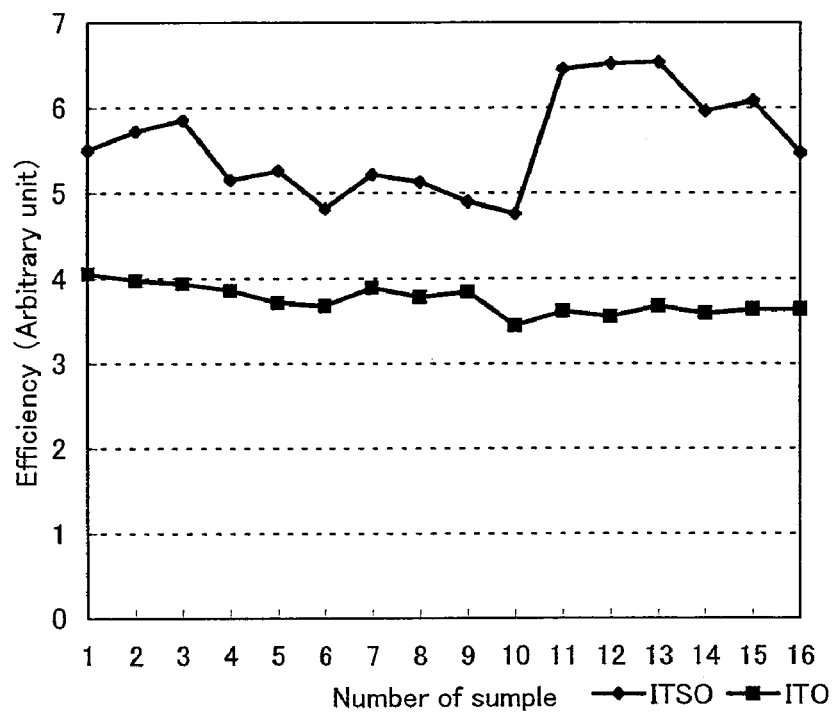
FIG. 4 shows a graph showing a laboratory results of display a light emitting device according to this embodiment and a comparative example and showing a ratio of luminance with respect to current (an arbitrary dial).

FIG. 3 shows laboratory results of display of light emitting devices according to this embodiment and the comparative examples using results of other samples formed in the like manner. The graph in FIG. 3 shows lot numbers, positions of panels extracted from a substrate, current, and luminance. In comparing each sample, samples according to this embodiment using ITSO for the hole injection electrode have higher ratio of luminance with respect to current (current efficiency). FIG. 4 shows ratios (arbitrary unit) of luminance with respect to current in 16 samples. As to all samples, samples according to this embodiment each using ITSO for the hole injection layer sample have 1.47 times higher on average than samples of the comparative examples.

As described above, high current efficiency can be obtained with a light emitting device according to the invention.

This application is based on Japanese Patent Application serial no. 2003-308126 filed in Japan Patent Office on 29 Aug., 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A method for manufacturing a light emitting element, comprising the steps of:
   forming a first layer over and in contact with an anode; and
   forming a hole injection layer or a hole transport layer comprising an organic compound over the first layer;
   wherein the anode comprises a light transmitting conductive oxide and silicon oxide,
   wherein the light transmitting conductive oxide is selectively removed to form the first layer comprising the silicon oxide, and
   wherein the first layer is formed so that a concentration of silicon oxide in the first layer is higher than a concentration of silicon oxide in the anode.

2. The method according to claim 1,
   wherein the first layer is formed so that the concentration of silicon oxide in the first layer is higher than the concentration of silicon oxide in the anode.

3. The method according to claim 1,
   wherein the light transmitting conductive oxide is selected from indium tin oxide, zinc oxide, indium zinc oxide, and zinc oxide containing gallium.

4. The method according to claim 1,
   wherein the light transmitting conductive oxide is indium tin oxide.

5. The method according to claim 1,
   wherein the first layer is formed at a thickness ranging from 0.5 nm to 5 nm.

6. A method for manufacturing a light emitting element, comprising the steps of:
   forming an anode comprising a light transmitting conductive oxide and silicon oxide;
   selectively removing the light transmitting conductive oxide from a surface of the anode a top portion of the anode so that a concentration of silicon oxide at the top portion of the anode is increased; and
   forming a hole injection layer or a hole transport layer comprising an organic compound over the anode.

7. The method according to claim 6,
   wherein the light transmitting conductive oxide is selected from indium tin oxide, zinc oxide, indium zinc oxide, and zinc oxide containing gallium.

8. The method according to claim 6,
   wherein the light transmitting conductive oxide is indium tin oxide.

9. The method according to claim 6,
   wherein the step of removing the light transmitting conductive oxide is performed by treating the surface of the anode with plasma.

10. The method according to claim 6,
    wherein the step of removing the light transmitting conductive oxide is performed by treating the surface of the anode with plasma in the presence of a gas selected from hydrogen, oxygen, fluorine, nitrogen, and argon.

11. The method according to claim 6, wherein the step of removing the light transmitting conductive oxide is performed by treating the surface of the anode with plasma in the presence of a gas selected from hydrogen, oxygen, and fluorine.

12. The method according to claim 6, wherein the step of removing the light transmitting conductive oxide is performed by irradiating the surface of the anode with UV light.

* * * * *

UNITED STATES PATENT AND TRADEMARK OFFICE
CERTIFICATE OF CORRECTION

| | |
|---|---|
| PATENT NO. | : 8,012,529 B2 |
| APPLICATION NO. | : 11/779363 |
| DATED | : September 6, 2011 |
| INVENTOR(S) | : Junichiro Sakata |

It is certified that error appears in the above-identified patent and that said Letters Patent is hereby corrected as shown below:

Column 14, line 47, in claim 6, delete "a surface of the anode"

Signed and Sealed this
Sixth Day of March, 2012

David J. Kappos
*Director of the United States Patent and Trademark Office*